(12) United States Patent
Hoffmann et al.

(10) Patent No.: US 8,192,548 B2
(45) Date of Patent: Jun. 5, 2012

(54) ARRANGEMENT FOR COATING A SUBSTRATE

(75) Inventors: Uwe Hoffmann, Alzenau (DE); Manfred Schreil, Dresden (DE); Jose Manuel Dieguez-Campo, Hanau (DE); Marcus Bender, Hanau (DE)

(73) Assignee: Applied Materials GmbH & Co. KG, Alzenau (DE)

( * ) Notice: Subject to any disclaimer, the term of this patent is extended or adjusted under 35 U.S.C. 154(b) by 962 days.

(21) Appl. No.: 11/254,425

(22) Filed: Oct. 20, 2005

(65) Prior Publication Data

US 2006/0130765 A1     Jun. 22, 2006

(30) Foreign Application Priority Data

Dec. 17, 2004   (EP) ..................................... 04029928

(51) Int. Cl.
*C23C 14/00*     (2006.01)
*C23C 16/00*     (2006.01)
(52) U.S. Cl. .................... 118/726; 118/720; 118/718
(58) Field of Classification Search ............... 118/726, 118/718, 720; 219/420, 421
See application file for complete search history.

(56) References Cited

U.S. PATENT DOCUMENTS

| 3,561,484 | A | 2/1971 | Taplin |
| 3,887,162 | A | 6/1975 | Antoni et al. |
| 4,195,666 | A | 4/1980 | Goetz et al. |
| 5,554,220 | A | 9/1996 | Forrest et al. |
| 6,101,316 | A | * | 8/2000 | Nagashima et al. ......... 392/388 |
| 6,749,906 | B2 | * | 6/2004 | Van Slyke ..................... 427/591 |
| 2002/0185069 | A1 | | 12/2002 | Hoffmann et al. |
| 2003/0145789 | A1 | | 8/2003 | Bauch et al. |
| 2007/0095289 | A1 | * | 5/2007 | Arami ........................... 118/725 |

FOREIGN PATENT DOCUMENTS

| DE | 30 15 487 A1 | 10/1981 |
| DE | 201 15 333 U1 | 3/2002 |
| EP | 0 962 260 A1 | 12/1999 |
| EP | 1 357 200 A1 | 10/2003 |
| EP | 1 401 036 A2 | 3/2004 |
| JP | 10-168560 | 6/1998 |
| JP | 2000120551 A | 4/2000 |
| JP | 2001208478 A * | 8/2001 |
| JP | 2002030418 A * | 1/2002 |
| JP | 2002-324310 | 11/2002 |
| TW | 527435 B | 4/2003 |

\* cited by examiner

*Primary Examiner* — Ram N. Kackar
(74) *Attorney, Agent, or Firm* — Fulbright & Jaworski L.L.P.

(57) ABSTRACT

The invention relates to an arrangement for the coating of substrates, which comprises an evaporation source and a vapor barrier between the evaporation source and the substrate. The vapor barrier is maintained at a temperature which is at least equal to or above the vaporization temperature of the material to be vaporized. The vapor barrier is implemented as a quartz valve, which includes a spherical closure part connected with a movable rod. In a first position this spherical closure part closes a vapor conducting tube, which is connected with the evaporation source, and, in a second position, the spherical closure part abuts a spherical calotte which seals off a quartz tube.

14 Claims, 3 Drawing Sheets

ARRANGEMENT FOR COATING A SUBSTRATE

BACKGROUND AND SUMMARY OF THE INVENTION

This application claims priority from European Patent Application No: 04 029 928.1 filed Dec. 17, 2004, herein incorporated by reference in its entirety.

The invention relates to an arrangement for coating a substrate.

Recent developments in the production of flat screens for computers or television sets are oriented toward the so-called organic light-emitting diodes (OLEDs). The production of OLEDs can take place by means of OVPD technology (OVPD—Organic Vapor Phase Deposition, U.S. Pat. No. 5,554,220), in which a carrier gas stream at very low pressure in a heated reactor takes up organic materials and deposits these as thin layers on a substrate.

In another method for coating a substrate with a thin organic layer, a substrate holder with heating means is provided, which holds on its lower surface a substrate, for example glass (EP 0 962 260 A1=U.S. Pat. No. 6,101,316). Beneath this substrate are provided two evaporation sources, which vaporize organic material, which is deposited on the substrate if a shutter disposed between the substrate and the vaporizer is opened.

Also known is an electrically actuated valve for glass apparatus, which can be opened and closed by means of an electric motor (DE 201 15 333 U1). The valve body is herein implemented as a cylinder.

Further is known an all-metal valve with a slidable and a resting sealing partner, of which the one sealing partner is implemented in the form of a plate (DE 30 15 487 A1). This valve comprises an additional sealing partner, which becomes operational if the plate-shaped sealing partner is defective.

In another known valve the valve body is implemented as a ball, this ball being capable of closing a cylindrical tube (Japan 2000120551 A).

A ball-shaped body also comprises a valve, which can be utilized in the environment of aggressive materials (U.S. Pat. No. 3,887,162).

A valve is furthermore known, which comprises a ball-shaped closure body (U.S. Pat. No. 4,195,666). This valve is utilized for controlling highly corrosive fluids. It has the capacity of blocking fluids in two different positions.

A servo-controlled valve for mixing two fluids in a specific ratio is disclosed in U.S. Pat. No. 3,561,484. This valve also comprises a ball-shaped closure body.

An evaporation apparatus with a source for vaporized organic material comprising an on-off valve is known from U.S. Pat. No. 6,101,316. An evacuation device is herein connected with a container containing organic material, the evacuation device evacuating the container when the valve is closed.

Arrangements for the evaporation of OLED materials are also disclosed in EP 1 357 200 A1 and EP 1 401 036 A2.

Lastly, an arrangement for coating an areal substrate is known, which comprises a stationary evaporation source for the vaporization of materials, with which the substrate is to be coated (DE 102 24 908 A1). This arrangement comprises a driving means which moves the areal substrate relative to the evaporation source. It comprises, in addition, a first distributor arrangement, which linearly distributes the vapor emitted by the evaporation source, as well as a second distributor arrangement, which is disposed at its one end at least in the proximity of the evaporation source and which terminates with its other end in the first distributor arrangement. This known arrangement is layed out for continuous evaporation, which means, a coating process once started is to be carried out over several hours or days. Due to good insulation and a large thermal mass, the control behavior of the evaporation source is very slow. From the time the heating means of the evaporation source is switched on, it takes more than one hour before a desired rate is reached, and the switching-off of the evaporation source—from the time the heating means is switched off until the evaporation rate is zero—takes a correspondingly long time.

During this time the very expensive material is vaporized from the evaporation source without being utilized for coatings. If between the substrate and the evaporation source a shutter is provided, the material becomes deposited on this shutter. A short-term interruption of the evaporation of a few minutes is not possible.

The invention therefore addresses the problem of interrupting the material flow from the evaporation source to the substrate and simultaneously saving evaporation material.

The problem is resolved according to the present invention, which relates in part to an arrangement for coating a substrate, which comprises an evaporation source and a vapor barrier between the evaporation source and the substrate. The vapor barrier is maintained at a temperature which is at least equal to or greater than the vaporization temperature of the material to be vaporized.

The vapor barrier is implemented as a quartz valve, which includes a ball-shaped closure part connected with a movable rod. In a first position this ball-shaped closure part closes a vapor conducting tube connected with the evaporation source, and, in a second position, the ball-shaped closure part abuts a spherical calotte which seals off a quartz tube.

The advantage obtained with the invention resides in particular therein that the evaporation is interrupted and therewith no deposition of the material onto structural parts occurs, which are not the substrate. Thus, on the one hand, with the valve closed the substrate is no longer coated and, on the other hand, evaporation material is no longer consumed. Through the particular implementation of the vapor barrier as a special valve it is ensured that in the open position of the valve, on the one hand, the tube cross section is made available for the vapor flow and, on the other hand, the rearward space of the valve is sealed off against the penetration of the vapor into the valve guide so that it does not become stuck.

A special implementation of the valve is described herein.

An embodiment example of the invention is shown in the drawing and will be described in the following in further detail.

DETAILED DESCRIPTION

Figure 1:
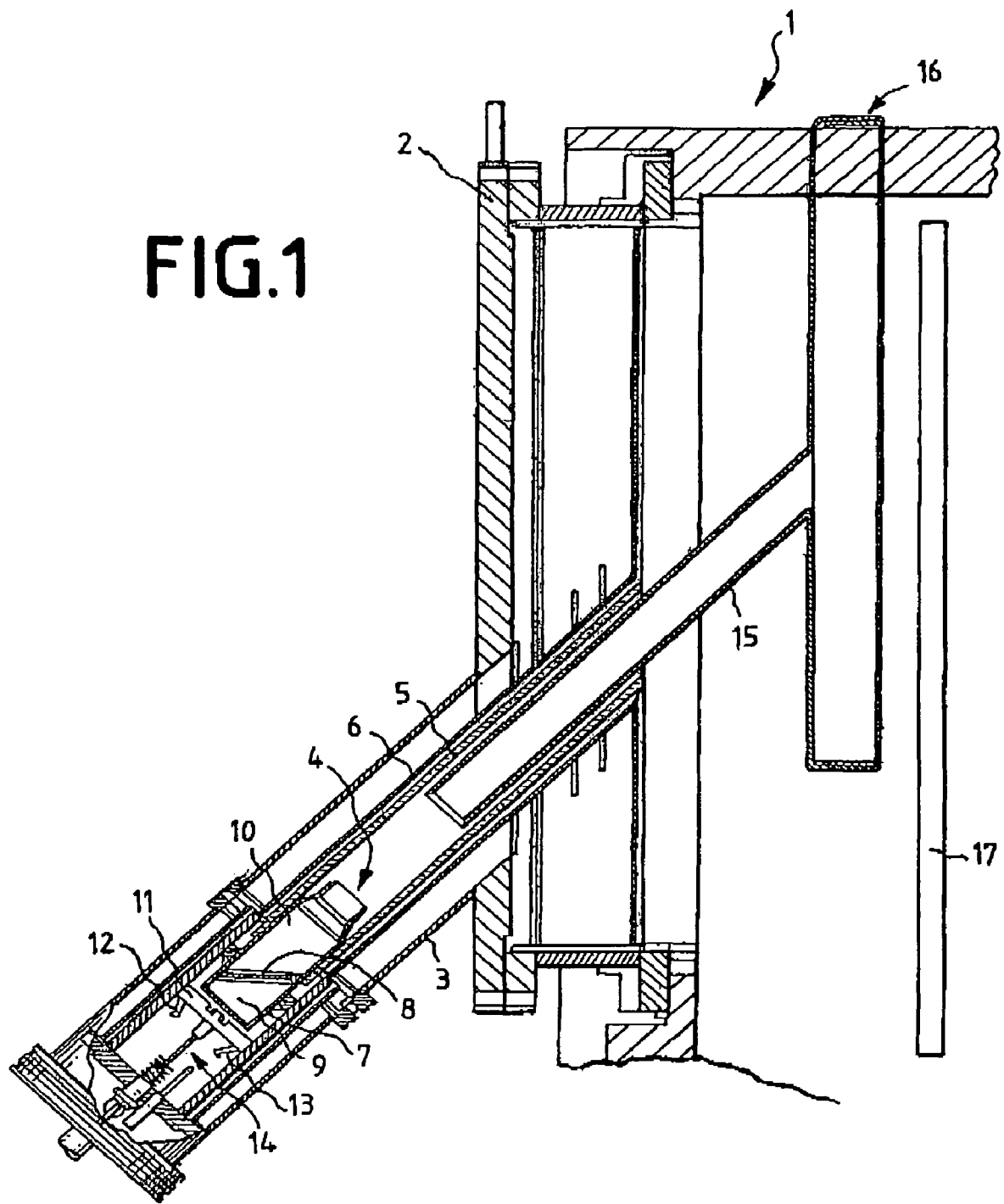
FIG. 1 a section through the essential structural parts of a coating installation, FIG. 2 a variant of the installation according to FIG. 1 with a closed valve, FIG. 3 the installation according to FIG. 2 with the valve open.

FIG. 1 shows the essential structural parts of a coating installation 1 known per se. Herein denotes 2 a support plate, onto which is flanged a tubular housing 3 in which an evaporation source 4 is located. This evaporation source 4 is encompassed by a ceramic tube 5, which, in turn, is encompassed by a metallic protecting tube 6. The evaporation source 4 includes a crucible 7 provided with a partitioning wall 8, which separates an empty space 9 from a material space 10. In the material space 10 is located the organic substance which is to be vaporized. Beneath the crucible 7 is a stay 11 with staying springs 12, 13 and a heat sensor 14. Above the evaporation source 4 is located a quartz tube 15, which is connected at an angle of approximately 45° with a further quartz tube 16. In front of the quartz tube 16 is located the substrate 17 to be coated. Further details of the structure of the coating installation 1 can be found in DE 102 24 908 A1.

Figure 2:
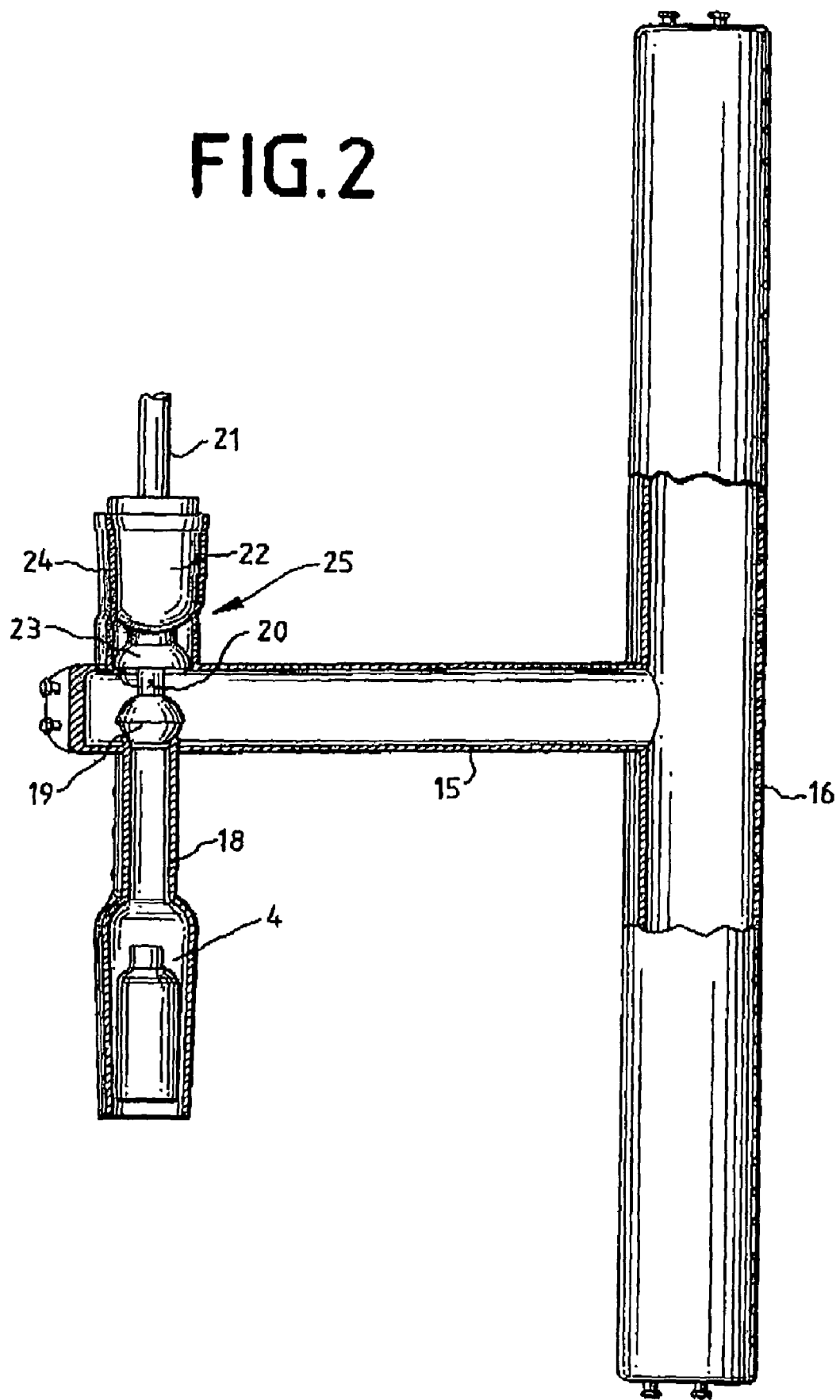

FIG. 2 shows the two quartz tubes 15 and 16 again, the quartz tube 15 now extending perpendicularly to the quartz tube 16. Quartz tube 15 not only terminates with its one end in the quartz tube 16, but rather is connected in the proximity of its other end with a further quartz tube 18, in which is located the evaporation source 4. In the illustration of FIG. 2 the upper end of the quartz tube 18 is closed off by means of a glass sphere 19. This glass sphere 19 is connected with a glass rod 20, 21 guided by a ram 22 at whose lower end is disposed a spherical calotte 23. The arrangement illustrated in FIG. 2 further shows a hemispherical calotte 23, which is attached to a cylindrical body at the top, which is tied to the ram 22. The calotte 23, cylindrical body and ram 22 are enclosed within the valve 25, which is perpendicularly attached to a tube 15.

In the open state the spherical calotte 23 seals upwardly the space formed by a ram guide 24. Quartz tube 18, sphere 19, glass rod 20 and spherical calotte 23 are brought by means of a heating means (not shown) to a temperature which is slightly above the temperature at which the material in the evaporation source 4 vaporizes.

In the closed state of the valve 25 the sphere 19 presses onto the opening of the quartz tube 18 thereby closing it. Since the vapor can neither become condensed on the inner wall of quartz tube 18 nor on the lower surface of the sphere 19, vapor pressure builds up in the quartz tube 18, which prevents the further vaporization of the material located in the evaporation source 4.

With the opening of the valve the sphere 19 is raised upwardly by means of the glass rod 20, 21 whereupon it closes the spherical calotte 23.

Contamination of the glass rod 20, 21, of the spherical calotte 23 and of the ram 22 with the vaporized material from the evaporation source 4 is thereby prevented.

The arrangement depicted in FIG. 2 of the quartz tubes 15, 16, 18 is not absolute. The valve 25 in the arrangement according to FIG. 1 could also be disposed on the quartz tube 15 depicted here.

Figure 3:
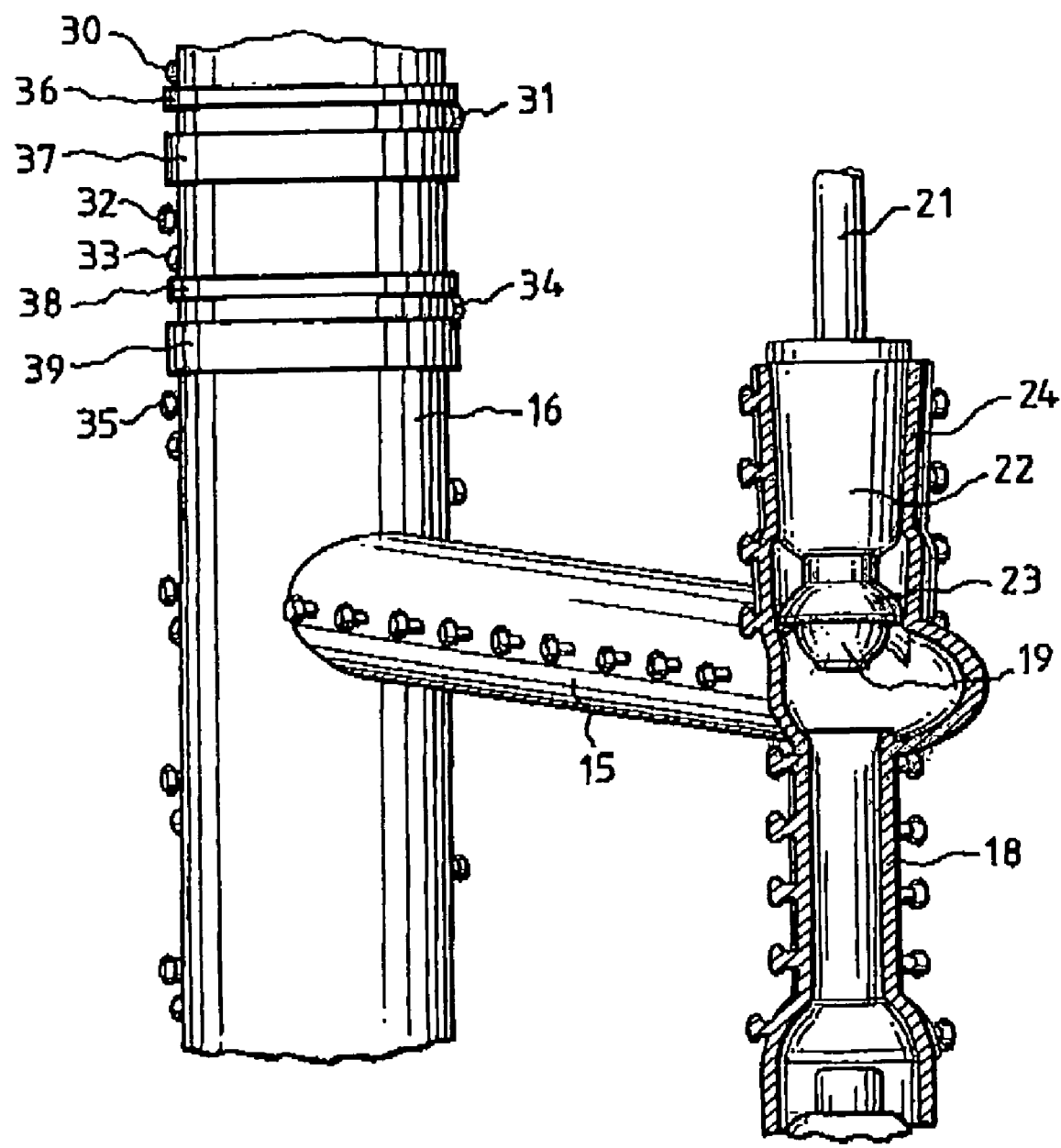

FIG. 3 shows a portion of the arrangement depicted in FIG. 2 in perspective view. Quartz tubes 15 and 16 are herein not shown in section, while tubes 18 and 24 are again shown in section.

On the quartz tubes 15, 16, 18 several nipples are evident, of which only nipples 30 to 35 are provided with reference numbers. These nipples serve the purpose of maintaining heating coils 36 to 39, of which only some are depicted, on their position.

With the aid of the heating coils the quartz tubes 15, 16, 18, 24 are brought to a temperature which corresponds to the vaporization temperature of the material to be vaporized. The sphere 19, which, in the representation of FIG. 3, rests in the spherical calotte 23, is heated in its position according to FIG. 2 through the heated tube 18 and, in its position according to FIG. 3, brought to the specified temperature via tube 24, ram 22, and spherical calotte 23.

The valve depicted in FIGS. 2 and 3 should be heatable to at least 500° C. so that vaporized material cannot condense on its walls. It is to be comprised of quartz glass, which, on the one hand, can withstand the high temperatures and, on the other hand, is chemically inert, such that the OLED materials do not decompose, which would occur in contact with, for example, high-grade steel.

It is claimed:

1. An arrangement for coating a substrate comprising:
   an evaporation source for the evaporation of materials with which the substrate is to be coated; a vapor conducting arrangement from the evaporation source to the substrate, said vapor conducting arrangement including at least two tubes which are perpendicular to each other; and
   a valve comprising a mechanical vapor barrier in the vapor conducting arrangement; wherein the mechanical vapor barrier comprises a sphere at an opening of one of the tubes being connected to a rod, a ram within a ram guide, a rod that is arranged in parallel with one of the tubes which are perpendicular to each other; and a spherical calotte connected to a sphere, wherein, when the sphere is raised upwardly by the rod, it closes the spherical calotte so that the contamination of the rod, the ram and the spherical calotte with vaporized material is prevented;
   wherein the arrangement further comprises a hemispherical calotte, which is attached to a neck shaped cylindrical body at the top, which is further tied to the ram, and wherein said hemispherical calotte, cylindrical body and ram are enclosed within the valve, which is perpendicularly attached to a tube; wherein the valve is heatable to at least 500° C.

2. An arrangement as claimed in claim 1, wherein the temperature of the vapor barrier is 5% to 50% above the vaporization temperature of the material to be vaporized.

3. An arrangement as claimed in claim 1, wherein the vapor conduction arrangement is maintained at the same temperature as the vapor barrier.

4. An arrangement as claimed in claim 1, wherein the vapor barrier is comprised of quartz.

5. An arrangement as claimed in claim 1, wherein the vapor conducting arrangement is comprised of quartz.

6. An arrangement as claimed in claim 1, wherein the vapor barrier is a valve.

7. An arrangement as claimed in claim 1, wherein the vapor conducting arrangement includes at least one quartz tube.

8. An arrangement as claimed in claim 1, wherein the vapor conducting arrangement comprises two quartz tubes, the vapor barrier being provided between the one quartz tube and the other quartz tube.

9. An arrangement as claimed in claim 1, comprising two of said vapor conducting arrangements, wherein said two vapor conducting arrangements connected with one another are perpendicular on one another and the longitudinal axis of a rod coincides with the longitudinal axis at least of the one vapor conducting arrangement.

10. An arrangement as claimed in claim 9, wherein the vapor barrier comprises quartz.

11. An arrangement as claimed in claim 1, wherein the vapor conducting arrangement is provided with nipples for mounting heating coils.

12. An arrangement as claimed in claim 11, wherein the nipples comprise quartz glass.

13. An arrangement as claimed in claim 11, wherein the vapor barrier comprises quartz.

14. An arrangement as claimed in claim 1, wherein the materials to be vaporized are organic materials for the production of light-emitting diodes.

* * * * *